US008952486B2

(12) United States Patent
Yang et al.

(10) Patent No.: US 8,952,486 B2
(45) Date of Patent: Feb. 10, 2015

(54) ELECTRICAL FUSE AND METHOD OF MAKING THE SAME

(75) Inventors: Chih-Chao Yang, Glenmont, NY (US);
Stephen M. Gates, Ossining, NY (US);
Baozhen Li, South Burlington, VT (US);
Dan Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 326 days.

(21) Appl. No.: 13/085,568

(22) Filed: Apr. 13, 2011

(65) Prior Publication Data

US 2012/0261793 A1   Oct. 18, 2012

(51) Int. Cl.
*H01L 23/525* (2006.01)

(52) U.S. Cl.
CPC ................... *H01L 23/5256* (2013.01)
USPC ............. 257/529; 257/E23.149; 257/E21.592

(58) Field of Classification Search
CPC ............ H01L 23/5256; H01L 27/1203; H01L 23/5252; H01L 45/144; H01L 45/146; H01L 27/2409; H01L 45/1226; H01L 2924/00014; H01L 25/0657; H01L 21/76898; H01L 2224/13184; H01L 2924/01327; H01L 2225/06524; H01L 2224/97; H01L 27/12; H01L 23/528; H01L 45/04
USPC ............ 257/529, E23.149, E21.592; 438/601
See application file for complete search history.

(56) References Cited

U.S. PATENT DOCUMENTS

| 4,536,948 | A | | 8/1985 | Te Velde et al. | |
| 5,389,814 | A | * | 2/1995 | Srikrishnan et al. | 257/529 |
| 6,033,939 | A | * | 3/2000 | Agarwala et al. | 438/132 |
| 6,294,453 | B1 | * | 9/2001 | Marmillion et al. | 438/601 |
| 6,879,018 | B2 | | 4/2005 | Marr et al. | |
| 7,009,275 | B2 | * | 3/2006 | Kim | 257/529 |
| 7,119,414 | B2 | * | 10/2006 | Hisaka | 257/529 |
| 7,388,273 | B2 | * | 6/2008 | Burr et al. | 257/529 |
| 7,491,585 | B2 | | 2/2009 | Yang et al. | |
| 7,671,443 | B2 | | 3/2010 | Lee | |
| 7,750,335 | B2 | | 7/2010 | Clevenger et al. | |
| 7,867,832 | B2 | | 1/2011 | Yang et al. | |
| 2001/0042897 | A1 | * | 11/2001 | Yeh et al. | 257/529 |
| 2003/0141568 | A1 | * | 7/2003 | Sato et al. | 257/529 |
| 2004/0209404 | A1 | | 10/2004 | Wang et al. | |
| 2006/0278895 | A1 | | 12/2006 | Burr et al. | |
| 2007/0023860 | A1 | | 2/2007 | Kim et al. | |
| 2009/0115020 | A1 | | 5/2009 | Yang et al. | |
| 2009/0155541 | A1 | | 6/2009 | Anderson et al. | |
| 2009/0267723 | A1 | * | 10/2009 | Hwang et al. | 337/290 |
| 2009/0294901 | A1 | | 12/2009 | Bonilla et al. | |
| 2009/0302416 | A1 | | 12/2009 | Abou-Khalil et al. | |

OTHER PUBLICATIONS

U.S. Appl. No. 12/187,864 Title: Interconnect Structure With Metal CAP SEL-Aligned to a Surface of an Embedded Conductive Material Filed: Aug. 7, 2008 Applicant(s): Conal E. Murray, et al.

(Continued)

*Primary Examiner* — Wael Fahmy
*Assistant Examiner* — Sarah Salerno
(74) *Attorney, Agent, or Firm* — Catherine Ivers; Reza Sarbakhsh

(57) ABSTRACT

An improved electrical-fuse (e-fuse) device including a dielectric layer having a first top surface, two conductive features embedded in the dielectric layer and a fuse element. Each conductive feature has a second top surface and a metal cap directly on the second top surface. Each metal cap has a third top surface that is above the first top surface of the dielectric layer. The fuse element is on the third top surface of each metal cap and on the first top surface of the dielectric layer. A method of forming the e-fuse device is also provided.

38 Claims, 3 Drawing Sheets

(56) References Cited

OTHER PUBLICATIONS

Technical Disclosure—"Fuses for CMOS Devices" Author(s): Disclosed Anonymously IP.com No. IPCOM000152856D Publication date: May 15, 2007.

Technical Disclosure—'On-Chip Electrically Programmable Fuse Author(s): Craig, W.J., Parent, R.M. IP.com No. IPCOM000061566D Publication date: Mar. 9, 2005.

Application No. PCT/US2012/032040 Filed: Apr. 4, 2012 Applicant: International Business Machines Corporation International Search Report and Written Opinion.

* cited by examiner

ELECTRICAL FUSE AND METHOD OF MAKING THE SAME

FIELD OF THE INVENTION

The present invention generally relates to integrated circuit design and fabrication. More particularly, the present invention relates to electrical fuses and methods of fabricating the electrical fuses.

BACKGROUND OF THE INVENTION

A fuse is an electrical connection in the form of a fusible link. Fuses have many applications in semiconductor industry. In one common application, a serial number or identification number is placed on a chip by setting fuses. In a second common application, a block or array of dynamic random access memory (DRAM) devices may be repaired by substituting a redundant block (array) for a failed block or array that could otherwise render the entire device inoperative. By selectively blowing fuses to select the DRAM device block (or array), the failed block is deactivated and the substituting redundant block is activated. The same method is used for static random access memory (SRAM) blocks. By replacing defective blocks (arrays) with redundant blocks, integrated circuit DRAM or SRAM yields are significantly improved.

In the past, a laser beam had been used to blow selected fuses in the DRAM or SRAM device repairing process described above. The laser blowing technique, however, has become increasingly difficult as the size of semiconductor devices decreases. As semiconductor devices become smaller, fuses in these devices have shrunk in size such that the fuse pitch is now smaller than the diameter of conventional laser beams. In addition, the density of circuits of semiconductor devices has increased. It is more and more difficult to blow a fuse with a laser beam without inadvertently damaging another part of the same fuse or neighboring circuits on the same semiconductor device. Furthermore, repairing or programming a semiconductor device requires blowing open thousands of fuses. It is also time consuming to blow open these many fuses by a laser beam.

More recently, electrical-fuses (e-fuses) have been developed for the DRAM or SRAM device repairing process. E-fuses can be blown by passing a high density electrical current through the fuse element. E-fuses take advantage of the electro-migration effect to selectively open up metal connections at desired locations within the fuse. The electro-migration effect has long been identified as a major metal failure mechanism. Electro-migration is a process in which ions of a metal conductor move in response to a high density current flow through the metal conductor. The ion movement leads to the formation of voids in the metal conductor. An e-fuse typically has a two-dimensional dog-bone shape with a narrow neck portion between two larger contact regions. Because the void formation rate is a function of current density, the narrow neck portion with the smallest cross-sectional area will experience the highest current density of the fuse and become discontinuous.

However, the conventional two-dimensional e-fuse generational scaling poses a barrier for on chip autonomic programming. As the operating voltage of semiconductor devices continues to be scaled down, it is increasingly difficult to achieve sufficiently high programming current to blow e-fuses in the devices. In addition, the high current needed to program the conventional e-fuse requires a wide programming transistor which consumes a significant silicon area. Accordingly, there exists a need for an e-fuse in which the absolute programming power can be scaled with the existing supplies.

SUMMARY OF THE INVENTION

The present invention provides an electrical-fuse (e-fuse) device which enables lower applied currents and voltages required to blow the fuse than that is required for a conventional e-fuse device. This is achieved through the current-crowding/divergence effect caused by topography existing in the fuse element of the e-fuse device. In addition, the present invention also provides a method for making such an e-fuse which minimizes additional processing steps and allows easy implementation of the invention in a back end of the line (BEOL) interconnect structure.

A first embodiment introduces an e-fuse device. The e-fuse device includes a dielectric layer having a first top surface; two conductive features embedded in the dielectric layer, each conductive feature having a second top surface and a metal cap directly on the second top surface, and each metal cap having a third top surface that is above the first top surface of the dielectric layer; and a fuse element on the third top surface of each metal cap and the first top surface of the dielectric layer.

A second embodiment introduces a method for forming an e-fuse device. The method includes providing a dielectric layer having two conductive features embedded therein, the dielectric layer having a first top surface and each conductive feature having a second top surface; selectively forming a metal cap directly on the second top surface of each conductive feature, each metal cap having a third top surface that is above the first top surface of the dielectric layer; and forming a fuse element on the third top surface of each metal cap and the first top surface of the dielectric layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 1:
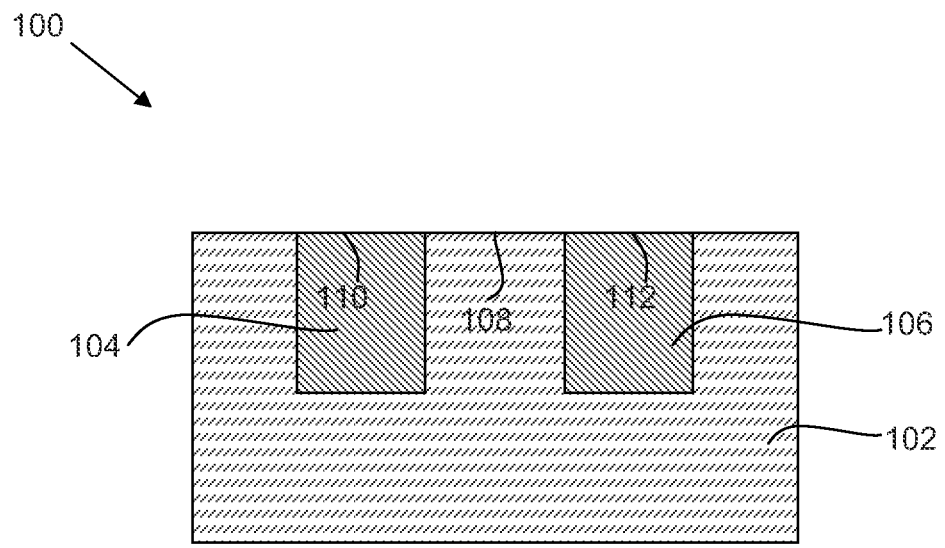
FIGS. 1-4 are cross-sectional views that illustrate the exemplary steps of a method of making an electrical fuse, in accordance with embodiments of the present invention.

It will be appreciated that for simplicity and clarity of illustration, elements shown in the drawings have not necessarily been drawn to scale. For example, the dimensions of some of the elements may be exaggerated relative to other elements for purpose of clarity.

DETAILED DESCRIPTION OF THE INVENTION

The present invention will now be described more fully hereinafter with reference to the accompanying drawings in which preferred embodiments of the invention are shown. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numerals refer to like features throughout.

It will be understood that when an element, such as a layer, is referred to as being "on" or "over" another element, it can be directly on the other element or intervening elements may also be present. In contrast, when an element is referred to as being "directly on" or "directly over" another element, there are no intervening elements present. It will also be understood that the term "surface" is used to include surfaces with topography which is not completely flat.

The present invention provides an electrical-fuse (e-fuse) device which enables lower applied currents and voltages required to blow the fuse through utilization of the current-crowding/divergence effect caused by topography within the fuse element. In addition, the proposed structure and method of the preferred embodiment minimizes additional processing steps and allows easy implementation of the invention in a BEOL interconnect structure.

Referring now to FIG. 1, there is shown an initial interconnect structure 100. The initial interconnect structure 100 includes a dielectric layer 102 and at least two conductive features 104 and 106. Conductive features 104 and 106 are embedded in the dielectric layer 102 and separated by the dielectric material which forms the dielectric layer 102. The dielectric layer 102 has a first top surface 108 which is between the two conductive features 104 and 106. The two conductive features 104 and 106 each have a second top surface (110 and 112 respectively). In one embodiment, the first top surface 108 is substantially coplanar with the second top surfaces 110 and 112. The initial interconnect structure 100 may be located above a semiconductor substrate (not shown) including one or more semiconductor devices. Optionally, the initial interconnect structure 100 may further include a diffusion barrier layer (not shown) which separates the conductive features 104 and 106 from the dielectric layer 102. The diffusion barrier layer is described below.

The initial structure 100 maybe made by conventional techniques well known to those skilled in the art. For example, the initial interconnect structure 100 can be formed by first applying the dielectric layer 102 to a surface of a substrate (not shown). The substrate may be a semiconducting material, an insulating material, a conducting material or a combination of two or more of the foregoing materials. When the substrate is comprised of a semiconducting material, a semiconductor material such as Si, SiGe, SiGeC, SiC, Ge alloys, GaAs, InAs, InP or other group III/V or II/VI semiconductor materials may be used. In addition to these listed types of semiconducting materials, the present invention also contemplates cases in which the substrate is a layered semiconductor such as, for example, Si/SiGe, Si/SiC, silicon-on-insulators (SOIs) or silicon germanium-on-insulators (SGOIs). When the substrate is a semiconducting material, one or more semiconductor devices such as, for example, complementary metal oxide semiconductor (CMOS) devices may be fabricated thereon.

When the substrate is an insulating material, the insulating material can be an organic insulator (i.e., carbon-based dielectric materials which do not contain Si), an inorganic insulator (i.e., Si-based dielectric materials) or a combination of an organic insulator and an inorganic insulator. The substrate can be either single layer or multilayers.

When the substrate is a conducting material, the substrate may include, for example, polysilicon, an elemental metal, an alloy of elemental metals, a metal silicide, a metal nitride or a combination of two or more of the foregoing materials. The substrate can be either single layer or multilayers.

The dielectric layer 102 may be any interlevel or intralevel dielectrics including inorganic dielectrics or organic dielectrics. The dielectric layer 102 may be porous or non-porous. Examples of suitable dielectrics that can be used as the dielectric layer 102 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or substituted aryl moieties which are linked together by bonds, fused rings, or inert linking groups such as, for example, oxygen, sulfur, sulfone, sulfoxide, carbonyl and the like.

Preferably, the dielectric layer 102 has a dielectric constant of about 4.0 or less. More preferably, the dielectric layer 102 has a dielectric constant of about 2.8 or less. These dielectrics generally have a lower parasitic crosstalk as compared with dielectric materials that have a dielectric constant higher than 4.0. The dielectric constants mentioned herein are measured in a vacuum.

The thickness of the dielectric layer 102 may vary depending on the dielectric material used as well as the exact number of dielectric films within the initial interconnects structure 100. Typically, and for normal interconnect structures, the dielectric layer 102 has a thickness from about 100 nm to about 450 nm.

The conductive features 104 and 106 may be formed by lithography. For example, a photoresist layer is applied to the surface of the dielectric layer 102. The photoresist layer is exposed to a desired pattern of radiation. The exposed photoresist layer is developed utilizing a resist developer. The patterned photoresist layer is used as an etch mask to transfer the pattern into the dielectric layer 102. The etched region of the dielectric layer 102 is then filled with a conductive material to form the conductive features 104 and 106.

The conductive features 104 and 106 include, but are not limited to, a conductive metal, an alloy of two or more conductive metals, a conductive metal silicide or a combination of two or more of the foregoing materials. Preferably, the conductive features 104 and 106 are a conductive metal such as Cu, Al, W, Ag, Ti, Ta or their alloys. More preferably, the conductive features 104 and 106 are Cu or a Cu alloy (such as AlCu). The conductive material is filled into the etched region of the dielectric layer 102 using a conventional deposition process including, but not limited to, chemical vapor deposition (CVD), plasma enhanced chemical vapor deposition (PECVD), sputtering, chemical solution deposition or plating to form the conductive features 104 and 106. After deposition, a conventional planarization process such as, for example, chemical mechanical polishing (CMP) can be used to provide a structure in which the conductive features 104 and 106 have top surfaces 110 and 112 that are substantially coplanar with the top surface 108 of the dielectric layer 102.

The conductive features 104 and 106 are preferably separated from the dielectric layer 102 by a diffusion barrier layer (not shown). The diffusion barrier layer may include, but is not limited to, Ta, TaN, Ti, TiN, Ru, RuN, RuTa, RuTaN, W, WN, Co, CoW, Mn, MnO, combinations of two or more of the foregoing materials or any other material that can serve as a barrier to prevent a conductive material from diffusing into a dielectric material layer. The diffusion barrier layer may be formed by a deposition process such as, for example, atomic layer deposition (ALD), CVD, PECVD, physical vapor deposition (PVD), sputtering, chemical solution deposition, or plating. The diffusion barrier layer may also include a bilayer structure that includes a lower layer of a metallic nitride such as, for example, TaN and an upper metallic layer such as, for example, Ta.

The thickness of the diffusion barrier layer may vary depending on the exact means of the deposition process as well as the material employed. Typically, the diffusion barrier layer has a thickness from about 2 nm to about 40 nm, with a thickness from about 4 nm to about 20 nm being more typical. During the planarization process described above, the diffusion barrier layer may also be planarized such that the diffusion barrier layer is also substantially coplanar with the dielectric layer 102 and the conductive features 104 and 106 in the initial interconnect structure 100.

Figure 2:
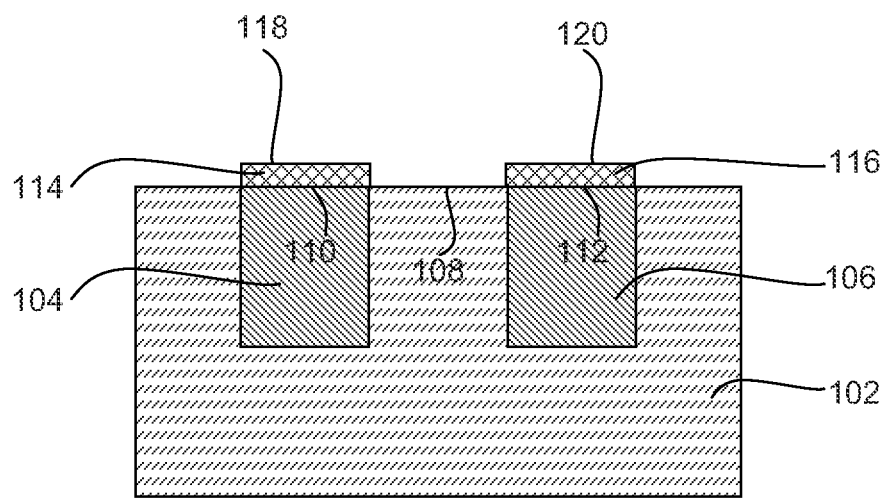

After forming the at least two conductive features 104 and 106 within the dielectric layer 102, two metal caps 114 and 116 are formed directly onto the conductive features 104 and 106 respectively (FIG. 2). The metal caps 114 and 116 are formed only on the conductive features 104 and 106. The metal caps 114 and 116 do not substantially extend onto the top surfaces of the dielectric layer 102. The phrase "does not substantially extend onto" is used in the present invention to denote that no or minimal metal cap material is directly on the top surfaces of the dielectric layer 102. The metal caps 114 and 116 have third top surfaces 118 and 120 respectively. In one preferred embodiment, the third top surfaces 118 and 120 are above the first top surface 108 of the dielectric layer 102.

The metal caps 114 and 116 are preferably a noble or refractory metal that is resistant to corrosion or oxidation. The preferred noble or refractory metals that can be used in the present invention are selected from the group consisting of Co, Ru, Ir, Rh, Pt, Ta, W, Mn, Mo, Ni, TaN, Ti, Al and alloys comprising at least one of the foregoing metals. In some embodiments, the metal caps 114 and 116 are comprised of a multilayered metal or metal alloy stack.

The thickness of the metal caps 114 and 116 may vary depending on the type of material used for the metal caps, the deposition technique and conditions, and the number of layers within the metal caps. Typically, the metal caps 114 and 116 have a thickness from about 1 nm to about 100 nm, with a thickness from about 1 nm to about 10 nm being more preferred. The metal caps 114 and 116 may be formed by a number of deposition techniques, including CVD, ALD, electroless plating and selective electrolytic plating.

Figure 3:
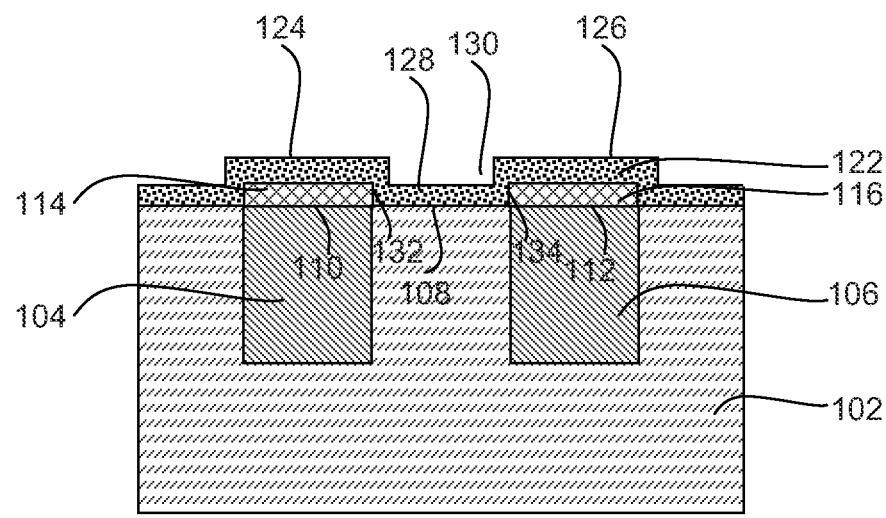

After selectively forming the metal caps 114 and 116 directly on the conductive features 110 and 112, a fuse element layer 122 is formed on the third top surfaces 118 and 120 and on the first top surface 108 of the dielectric layer 102 as shown in FIG. 3.

In one preferred embodiment, the fuse element layer 122 is in direct mechanical contact with the top surfaces 118, 120 and 108. Preferably, the fuse element layer 122 is a conformal film such that it substantially follows the topography of the top surfaces 118, 120 and 108. As shown in FIG. 3, the fuse element layer 122 has three top surfaces: the portion of the fuse element which is in direct mechanical contact with the top surface 108 has a top surface 128 and the portion of the fuse element which is in direct mechanical contact with the top surfaces 118 and 120 has top surfaces 124 and 126. Since the first top surface 108 is lower than the third top surfaces 118 and 120, the top surface 128 is below that the top surfaces 124 and 126. As a result, a recess 130 is formed in the fuse element 122. It is also preferred that the fuse element layer 122 is in direct mechanical contact with at least a side wall of each of the metal caps 114 and 116. In FIG. 3, the fuse element layer 122 is in direct mechanical contact with side walls 132 and 134 of the meal caps 114 and 116 respectively.

In another preferred embodiment, a diffusion barrier liner layer (not shown in FIG. 3) is formed on the third top surfaces 118 and 120 and on the first top surface 108 before the fuse element layer 122 is formed. The fuse element 122 is then formed on the diffusion barrier liner layer. The diffusion barrier liner layer can prevent potential reactions between the fuse element layer 122 and the metal caps 114 and 116. It can also prevent the fuse element layer 122 from diffusing into the underlying dielectric layer 102.

The diffusion barrier liner layer may include, but is not limited to, Ta, TaN, Ti, TiN, Ru, RuN, RuTa, RuTaN, W, WN, Co, CoW, Mn, MnO, combinations of two or more of the foregoing materials or any other material that can serve as a barrier to prevent a conductive material from diffusing into a dielectric material layer. The diffusion barrier liner layer may be formed by a deposition process such as, for example, ALD, CVD, PECVD, PVD, sputtering, chemical solution deposition, or plating. The diffusion barrier liner layer may also include a bilayer structure that includes a lower layer of a metallic nitride such as, for example, TaN and an upper metallic layer such as, for example, Ta.

The thickness of the diffusion barrier liner layer may vary depending on the exact means of the deposition process as well as the material employed. Typically, the diffusion barrier liner layer has a thickness from about 2 nm to about 40 nm, with a thickness from about 4 nm to about 20 nm being more typical.

In one preferred embodiment, the fuse element 122 can be Cu, Al, Cr, Ta, Ti, W, Mo, an alloy of two or more of the forgoing metals, and silicided polysilicon.

In another preferred embodiment, the fuse element is a programmable material such as a phase change material which can convert from a low resistivity state to a high resistivity state and vise versa by controlling the rate of cooling of the material after Joule heating with an applied electrical pulse. Examples of such a phase change material include, but are not limited to, doped and undoped $Ge_xSb_yTe_z$, doped and undoped $Ge_xSb_y$, doped and undoped $Sb_xTe_y$, doped and undoped $Ge_xTe_y$, and any other material that undergoes a reversible phase change which gives a change in conductivity of the material that can be controlled by Joule heating in the fuse structure. The low resistivity state of these phase change materials is often a crystalline state and is formed by slow cooling with a slow (e.g., microseconds or longer) trailing edge (TE) of an applied electrical pulse. The high resistivity state is an amorphous state and is formed by rapid cooling with a fast (e.g., 5-10 nanoseconds) TE of the applied electrical pulse. Thus, a fuse made with such materials may be reprogrammed multiple times. Preferably, the phase change material for the present invention should not undergo crystallization over a period of 10 years at temperature below 90° C., and more preferably at temperature below 120° C. In other embodiments, the programmable material for the present invention can be metal oxide such as $TiO_2$, NiO, $W_xO_y$ or $Ta_xO_y$.

The thickness of the fuse element 122 may vary depending on the type of material used and the deposition technique and conditions. Typically, the fuse element 122 has a thickness from about 1 nm to about 1000 nm, with a thickness from about 3 nm to about 100 nm being more preferred and a thickness from about 5 nm to about 50 nm being most preferred. The fuse element 122 may be formed by a number of deposition techniques, including, CVD, PECVD, PVD, ALD, evaporation, molecular beam epitaxy (MBE), a sol-gel or other spin-on and cure methods.

Figure 4:
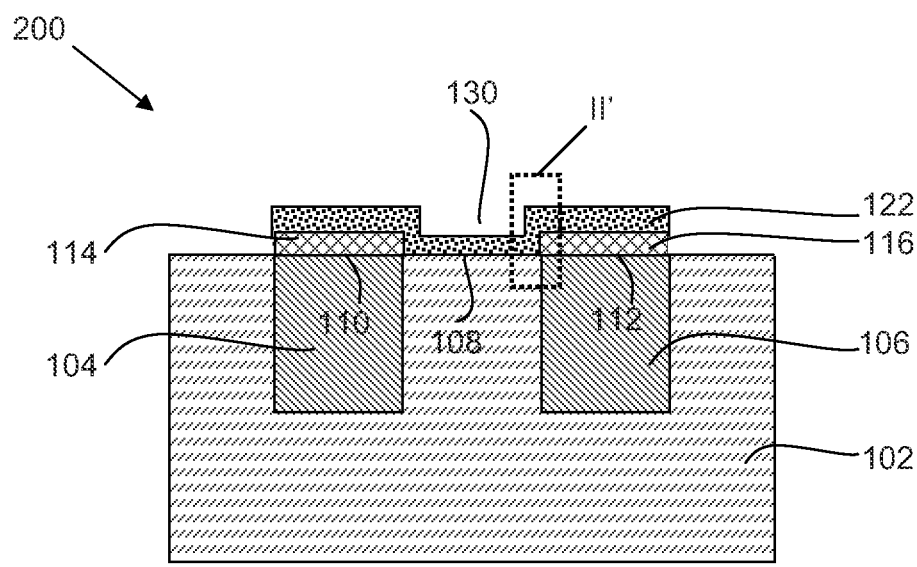

After the fuse element layer 122 is formed, it may be patterned photolithographically to remove the portions of the fuse element that are not in direct contact with the top surfaces 118, 120 and 108 (FIG. 4). For example, a photoresist layer is applied to the surface of the fuse element layer 122. The photoresist layer is exposed to a desired pattern of radiation. The exposed photoresist layer is developed utilizing a conventional resist developer. The patterned photoresist layer is used as an etch mask to remove the portions of the fuse element layer 122 and to form the final fuse structure 200. Within the scope of the invention, different mask and lithography schemes may be used to pattern the fuse element.

Figure 5:
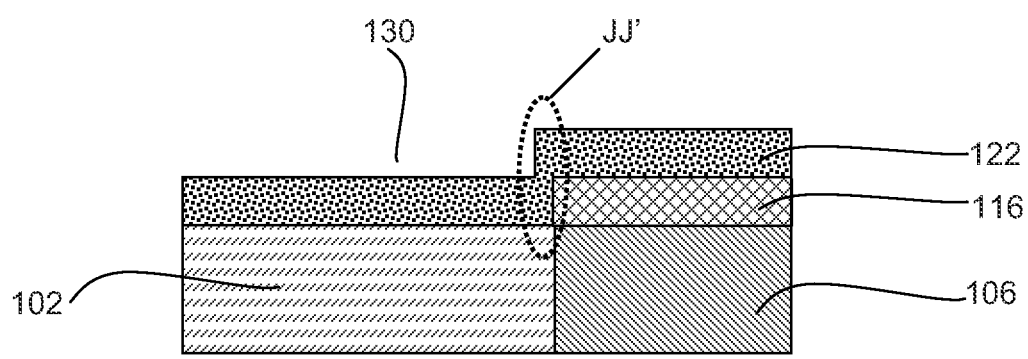
FIG. 5 is a cross-sectional view that illustrates a current-crowding/divergence effect that may result in the electrical fuse shown in FIG. 4.

As shown in FIG. 4, the final structure 200 has a topography which includes a recess 130. FIG. 5 is an enlarged illustration showing the rectangular box II' in FIG. 4. When a current flows through the fuse element 122, a current-crowding/divergence effect occurs in the portion of the fuse element in the oval box JJ'. The current-crowding/divergence effect causes a higher current density to be formed in this area. As a result, lower applied currents and voltages may be required to blow or reprogram the fuse element.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. An electrical-fuse (e-fuse) device comprising:
   a dielectric layer having a first top surface;
   two conductive features embedded in the dielectric layer, each conductive feature having a second top surface and a metal cap directly on the second top surface, and each metal cap having a third top surface that is above the first top surface of the dielectric layer; and
   a fuse element on the third top surface of each metal cap and on the first top surface of the dielectric layer,
   wherein the metal caps are above the dielectric layer and do not form a direct mechanical connection with any dielectric layer.

2. The e-fuse device of claim 1, wherein the first top surface is between the two conductive features.

3. The e-fuse device of claim 2, wherein the fuse element is in direct mechanical contact with the third top surface of each metal cap and the first top surface of the dielectric layer.

4. The e-fuse device of claim 3, wherein the top surface of a portion of the fuse element that is in direct mechanical contact with the first top surface of the dielectric layer is below the top surface of a portion of the fuse element that is in direct mechanical contact with the third top surface of each metal cap such that a recess is formed in the fuse element between the two metal caps.

5. The e-fuse device of claim 4, wherein the fuse element is in direct mechanical contact with a side wall of each metal cap.

6. The e-fuse device of claim 1, wherein the first top surface of the dielectric layer is substantially coplanar with the second top surface of each conductive feature.

7. The e-fuse device of claim 1, wherein the fuse element is selected from the group consisting of Cu, Al, Cr, Ta, Ti, W, Mo, alloys of two or more of the forgoing metals, and silicided polysilicon.

8. The e-fuse device of claim 1, wherein the fuse element is a programmable material.

9. The e-fuse device of claim 8, wherein the fuse element is selected from the group consisting of doped and undoped $Ge_xSb_yTe_z$, doped and undoped $Ge_xSb_y$, doped and undoped $Sb_xTe_y$, and doped and undoped $Ge_xTe_y$.

10. The e-fuse device of claim 8, wherein the fuse element is selected from the group consisting of $TiO_2$, NiO, $W_xO_y$ and $Ta_xO_y$.

11. The e-fuse device of claim 1, wherein the fuse element has a thickness from about 3 nm to about 100 nm.

12. The e-fuse device of claim 1, wherein the two metal caps are selected from the group consisting of Co, Ru, Ir, Rh, Pt, Ta, W, Mn, Mo, Ni, TaN, Ti, Al and alloys comprising at least one of the foregoing metals.

13. The e-fuse device of claim 1, wherein the two metal caps have a thickness from about 1 nm to about 10 nm.

14. The e-fuse device of claim 1, wherein the dielectric layer has a dielectric constant of about 4.0 or less.

15. The e-fuse device of claim 1, wherein the two conductive features are selected from the group consisting of Cu, Al, W, Ag, Ti, Ta and alloys comprising at least one of the foregoing metals.

16. The e-fuse device of claim 1, further comprising a diffusion barrier layer between the two conductive features and the dielectric layer.

17. The e-fuse device of claim 15, wherein the diffusion barrier layer is selected from the group consisting of Ta, TaN, Ti, TiN, Ru, RuN, RuTa, RuTaN, W, WN, Co, CoW, Mn, MnO and combinations comprising two or more of the foregoing materials.

18. The e-fuse device of claim 1, further comprising a diffusion barrier liner layer under the fuse element.

19. An electrical-fuse (e-fuse) device comprising:
    providing a dielectric layer having a first top surface;
    selectively forming two conductive features embedded in the dielectric layer, each conductive feature having a second top surface and a metal cap directly on the second top surface, and each metal cap having a third top surface that is above the first top surface of the dielectric layer; and
    forming a fuse element on the third top surface of each metal cap and on the first top surface of the dielectric layer,
    wherein the metal caps are above the dielectric layer and do not form a direct mechanical connection with any dielectric layer.

20. The method of claim 19, wherein the first top surface is between the two conductive features.

21. The method of claim 20, wherein the fuse element is in direct mechanical contact with the third top surface of each metal cap and the first top surface of the dielectric layer.

22. The method of claim 21, wherein the top surface of a portion of the fuse element that is in direct mechanical contact with the first top surface of the dielectric layer is below the top surface of a portion of the fuse element that is in direct mechanical contact with the third top surface of each metal cap such that a recess is formed in the fuse element between the two metal caps.

23. The method of claim 22, wherein the fuse element is in direct mechanical contact with a side wall of each metal cap.

24. The method of claim 19, wherein the first top surface of the dielectric layer is substantially coplanar with the second top surface of each conductive feature.

25. The method of claim 19, wherein the metal caps have a thickness from about 1 nm to about 10 nm.

26. The method of claim 19, wherein the fuse element has a thickness from about 3 nm to about 100 nm.

27. The method of claim 19, wherein the two metal caps are formed by chemical vapor deposition (CVD), atomic layer deposition (ALD), electroless plating or selective electrolytic plating.

28. The method of claim 27, wherein the two metal caps are selected from the group consisting of Co, Ru, Ir, Rh, Pt, Ta, W, Mn, Mo, Ni, TaN, Ti, Al and alloys comprising at least one of the foregoing metals.

29. The method of claim 19, wherein the fuse element is formed by vapor deposition (CVD), plasma enhanced chemical vapor deposition (PECVD), physical vapor deposition (PVD), atomic layer deposition (ALD), evaporation, molecular beam epitaxy (MBE), or a sol-gel method.

30. The method of claim 29, wherein the fuse element is selected from the group consisting of Cu, Al, Cr, Ta, Ti, W, Mo, alloys of two or more of the forgoing metals, and silicided polysilicon.

31. The method of claim 29, wherein the fuse element is a programmable material.

32. The method of claim 31, wherein the fuse element is selected from the group consisting of doped and undoped $Ge_xSb_yTe_z$, doped and undoped $Ge_xSb_y$, doped and undoped $Sb_xTe_y$, and doped and undoped $Ge_xTe_y$.

33. The method of claim 31, wherein the fuse element is selected from the group consisting of $TiO_2$, NiO, $W_xO_y$ and $Ta_xO_y$.

34. The method of claim 19, wherein the dielectric layer has a dielectric constant of about 4.0 or less.

35. The method of claim 19, wherein the two conductive features are selected from the group consisting of Cu, Al, W, Ag, Ti, Ta and alloys comprising at least one of the foregoing metals.

36. The method of claim 19, further comprising:
patterning the fuse element photolithographically.

37. The method of claim 19, further comprising:
forming a diffusion barrier layer between the two conductive features and the dielectric layer.

38. The method of claim 19, further comprising:
before forming the fuse element, forming a diffusion barrier liner layer on the third top surface of each metal cap and the first top surface of the dielectric layer.

* * * * *